United States Patent

Lakshmikumar

[11] Patent Number: 6,107,867
[45] Date of Patent: Aug. 22, 2000

[54] LOAD TERMINATION SENSING CIRCUIT

[75] Inventor: Kadaba R. Lakshmikumar, Wescosville, Pa.

[73] Assignee: Lucent Technologies Inc., Murray Hill, N.J.

[21] Appl. No.: 08/315,740

[22] Filed: Sep. 30, 1994

[51] Int. Cl.[7] ................................................. G05F 3/02
[52] U.S. Cl. ........................ 327/543; 327/110; 327/363; 330/259; 330/290
[58] Field of Search .................................. 327/538, 543, 327/545, 108, 110, 423, 424, 588, 378, 379, 362, 363; 326/30; 330/290, 259, 270

[56] References Cited

U.S. PATENT DOCUMENTS

| | | | |
|---|---|---|---|
| 3,434,069 | 3/1969 | Jones | 330/259 |
| 4,403,198 | 9/1983 | Müller | 330/265 |
| 4,598,216 | 7/1986 | Lauffer et al. | 326/30 |
| 4,859,877 | 8/1989 | Cooperman et al. | 326/30 |
| 5,006,817 | 4/1991 | Babanezhad | 330/255 |
| 5,361,042 | 11/1994 | Gist | 330/290 |
| 5,387,830 | 2/1995 | Kukimoto | 327/543 |
| 5,497,125 | 3/1996 | Royds | 330/290 |

FOREIGN PATENT DOCUMENTS 6286908  4/1987  Japan ..................................... 330/259

*Primary Examiner*—Timothy P. Callahan
*Assistant Examiner*—Terry L. Englund

[57] ABSTRACT

A method and apparatus for changing the open-loop frequency response of an amplifier in a line driver when the load to the line driver is removed. The load is detected by measuring the current to the load. When the current falls below a predetermined amount, the load is assumed to be disconnected and the open-loop frequency response of the amplifier is changed to shift a dominant pole of the line driver to a sufficiently low frequency to ensure stability of the line driver.

12 Claims, 3 Drawing Sheets

FIG. 2
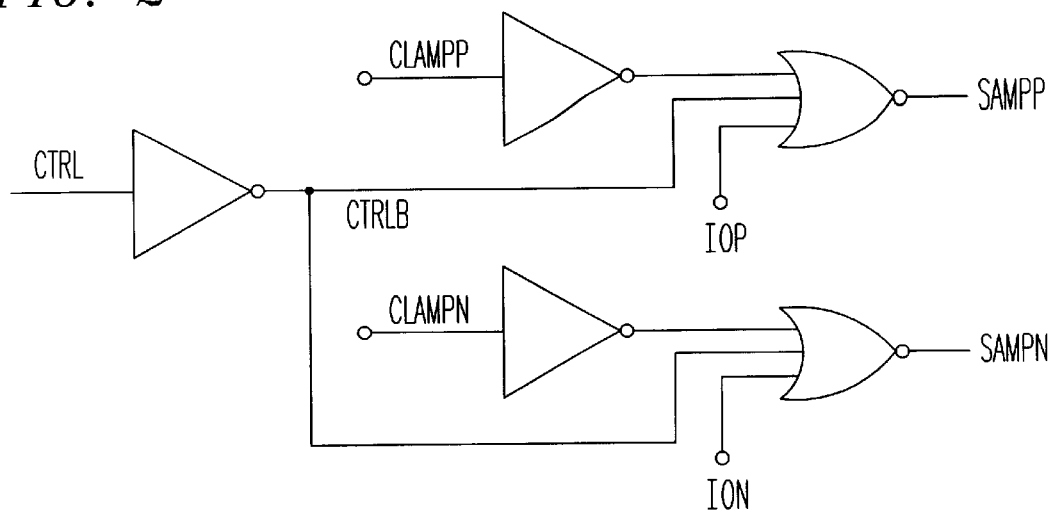
FIG. 4
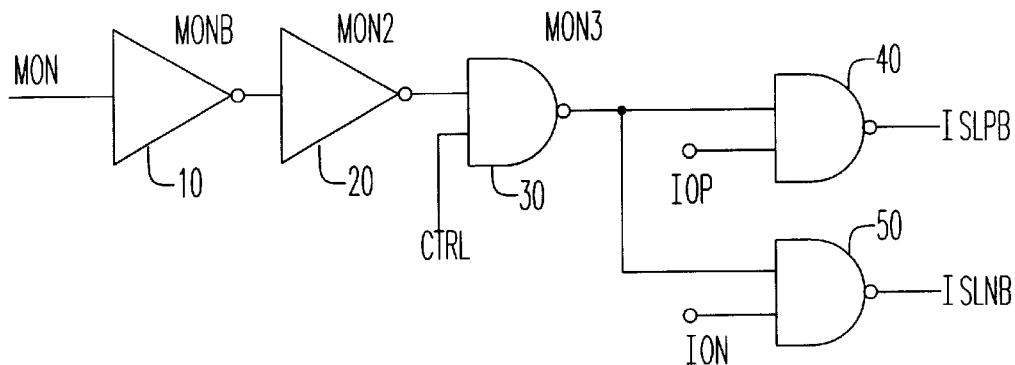
FIG. 5
| CASE | CTRL | MON | ISLPB | ISLNB | SAMPP | SAMPN |
|---|---|---|---|---|---|---|
| NOM. | 1 | 0 | $\overline{IOP}$ | $\overline{ION}$ | $\overline{IOP} \cdot CLAMPP$ | $\overline{ION} \cdot CLAMPN$ |
| UNTERM. | 1 | 1 | 1 | 1 | $\overline{IOP} \cdot CLAMPP$ | $\overline{ION} \cdot CLAMPN$ |
| NOM. | 0 | X | $\overline{IOP}$ | $\overline{ION}$ | 0 | 0 |
| UNTERM. | 0 | X | $\overline{IOP}$ | $\overline{ION}$ | 0 | 0 |

6,107,867

LOAD TERMINATION SENSING CIRCUIT

CROSS-REFERENCE TO RELATED APPLICATION

This patent application is being filed concurrently with patent application Ser. No. 08/607,619 entitled "Voltage Signal Line Driver," by Lakshmikumar ("Lakshmikumar 2"), filed Sep. 30, 1994, assigned to the assignee of the present invention and herein incorporated by reference. This concurrent application was issued May 20, 1997 as U.S. Pat. No. 5,631,595.

TECHNICAL FIELD

This invention relates to telecommunications, and more particularly, to a circuit for sensing the existence or presence of a termination load at the receiving end of a telecommunications line.

BACKGROUND OF THE INVENTION

In a telecommunications system, a voltage line driver or voltage signal line driver typically produces voltage signal pulses for transmission over a telecommunications line. Under normal termination, that is, where a load is present at the receiving end of the telecommunications line, the driver circuitry is such that the driver typically operates satisfactorily. However, when the termination resistance or load is removed or not present, the operation of the voltage signal line driver circuitry may be affected adversely. A need therefore exists for a technique for ensuring satisfactory operation of the voltage line driver even when the receiving end of the telecommunications line is not properly terminated.

SUMMARY OF THE INVENTION

Briefly, in accordance with one embodiment of the invention, a line driver has an amplifier and a current detector measuring the output current of the amplifier when the current is less than a predetermined amount, the openloop frequency response of the amplifier is changed. In accordance with another embodiment of the invention, a method of stabilizing a line driver having an amplifier by reducing the openloop gain of the amplifier. When the current from the amplifier to a load is less then a predetermined amount.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

FIG. 2 is a circuit diagram illustrating an embodiment of digital logic circuitry to produce digital control signals, such as for the embodiment(s) of a load termination sensing circuit in accordance with the invention illustrated in FIG. 1;

FIG. 4 is a circuit diagram illustrating an embodiment of additional digital logic circuitry to produce digital control signals, such as for the embodiment(s) of a load termination sensing circuit in accordance with the invention illustrated in FIG. 1;

FIG. 5 is a truth-table regarding the digital control signals associated with the digital logic circuitry of FIGS. 2 and 4.

DETAILED DESCRIPTION

Figure 1:
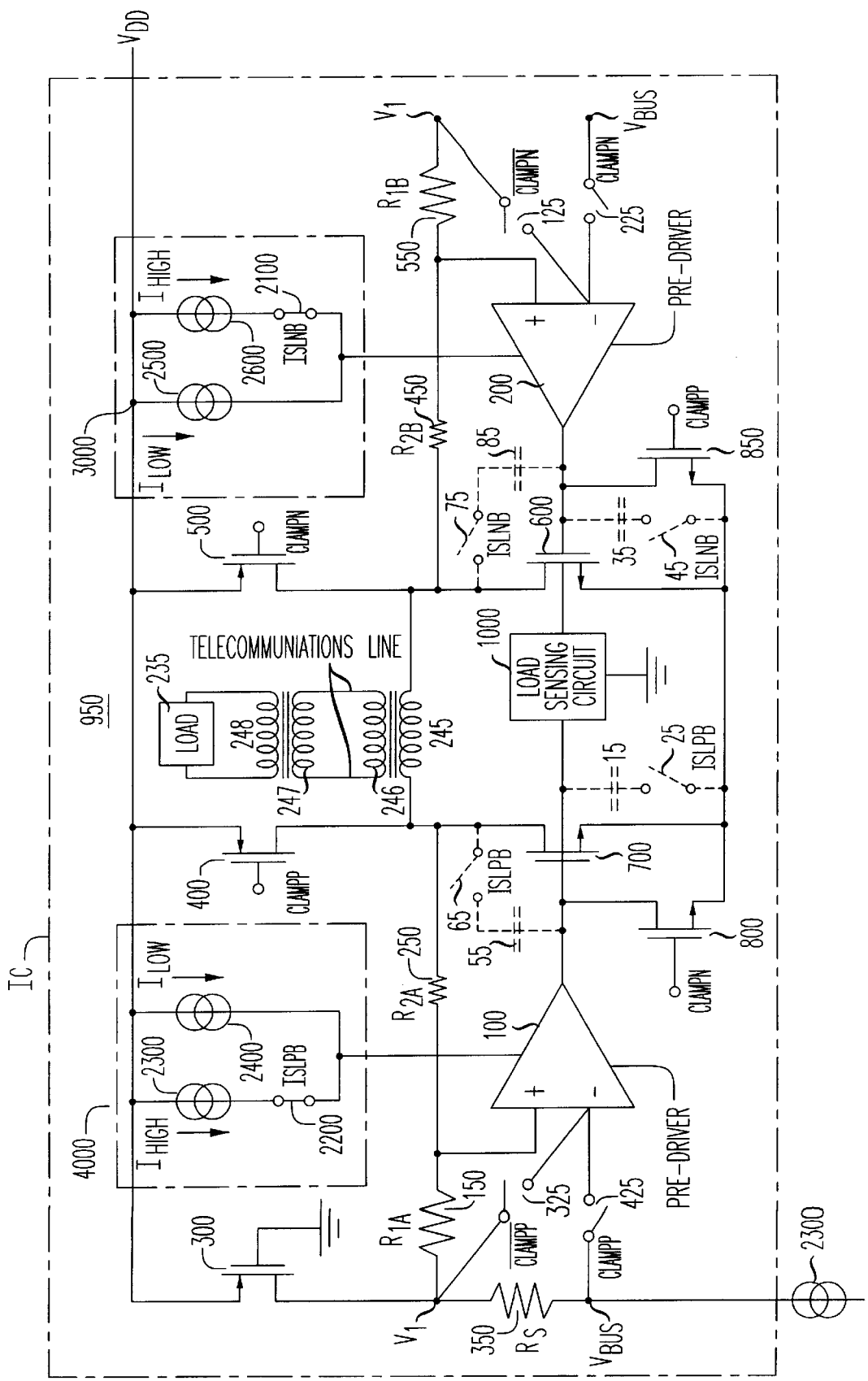
FIG. 1 is a circuit diagram illustrating an embodiment of a load termination sensing circuit in accordance with the invention (with features of alternative embodiments in accordance with the invention shown in phantom)

FIG. 1 is a circuit diagram illustrating an embodiment 950 of a load termination sensing circuit in accordance with the invention. Embodiment 950 is depicted as embodied in an integrated circuit chip (IC), although the scope of the invention is not limited in this respect. The load termination sensing circuit illustrated includes a voltage signal line driver, such as embodiment 900 of a voltage signal line driver in accordance with the invention described in aforementioned concurrently filed U.S. patent application Ser. No. 08/607,619 (Lakshmikumar 2). This embodiment of a voltage signal line driver or voltage line driver is incorporated in embodiment 950 of a load termination sensing circuit in accordance with the present invention, as illustrated in FIG. 1, although a load termination sensing circuit in accordance with the invention is not limited in scope in this respect. For example, other voltage or voltage signal line drivers may alternatively be employed.

Embodiment 950 of a load termination sensing circuit in accordance with the invention includes additional elements along with the voltage line driver, such as load sensing circuit 1000 and pre-driver biasing circuits 3000 and 4000, which are adapted to bias pre-driver amplifiers 100 and 200 illustrated in FIG. 1. As illustrated by the embodiment shown in FIG. 1, the pre-driver amplifiers illustrated may operate in a low current bias mode or a high current bias mode, the bias mode of the respective amplifiers being controlled at least in part by the respective biasing circuits illustrated. It will, of course, be appreciated that amplifiers may be biased by a number of different techniques and the scope of a load termination sensing circuit in accordance with the invention is not limited to the biasing approach illustrated for this particular embodiment. For example, instead of a current bias, a voltage bias may be employed. Likewise, in alternative embodiments, the amplifiers may have only one bias mode.

A voltage signal line driver, such as described in aforementioned patent application Ser. No. 08/607,619 (Lakshmikumar 2), is typically used to provide signals in the form of voltage pulses or voltage signal pulses for transmission over telecommunications lines. In such an application, the telecommunications line conventionally has a transmitting end and a receiving end, at least with respect to that line driver. At the transmitting end, as illustrated in FIG. 1, the voltage signal line driver is coupled to the telecommunications line. For example, as illustrated in FIG. 1, at the transmitting end, a first transformer, comprising a first coil 245 and a second coil 246, couples the line driver to the telecommunication line. Likewise, FIG. 1 illustrates a load 235 at the receiving end of the telecommunications line, hence the term "load at the receiving end of the telecommunications line." First coil 245 provides a type of "load" that is electrically and physically connected to the voltage signal line driver. Thus, coil 245 corresponds to load 115 shown in FIG. 1 of aforementioned patent application Ser. No. 08/607,619 (Lakshmikumar 2). Likewise, as illustrated in FIG. 1, second coil 246 is not physically connected, but is electromagnetically coupled, to first coil 245. As illustrated in FIG. 1, at the receiving end of the telecommunications line, another or second transformer, comprising a third coil 247 and a fourth coil 248, electromagnetically couples load 235 to the telecommunications line. However, with respect to the first transformer, the impedance associated with load 235 may be adjusted by an impedance scaling factor based on the presence of the second transformer comprising third coil 247 and fourth coil 248. Therefore, in this context, the term "load at the receiving end of the telecommunications line" may also refer to the load across coil 246 resulting from load 235 and the second transformer, for example. In the context of the invention, the term "load at the receiving end of the telecommunications line" therefore refers to a load, such as load 235 or its equivalent. When a voltage signal pulse is provided by a voltage signal driver, such as during ordinary circuit operation, that voltage signal pulse will ultimately appear across the load at the receiving end of the telecommunications line, such as load 235 illustrated in FIG. 3.

For a voltage signal line driver, such as the line driver of the embodiment illustrated in FIG. 1, the stability of the line driver is related to its open loop gain and phase as a function of frequency, i.e., the frequency response of the line driver. The open loop gain of the driver may have several components. In this particular embodiment, for example, the gain of the pre-driver amplifiers, such as 100 and 200 illustrated in FIG. 1, constitutes one component of the open loop gain. Likewise, the product of the transconductance of transistor 700 (or transistor 600) and the reflected load impedance of the termination, such as load 235, constitutes another component. The circuit has a parasitic pole due at least in part to the reflected load resistance and capacitance. For this particular embodiment, the voltage signal line driver also has a dominant pole due at least in part to the output resistance of the amplifiers, such as 100 and 200, and the gate capacitance of transistors 700 and 600.

Under normal termination, that is, when a load, such as load 235, appears at the receiving end of the telecommunications line, the gain values and locations of the poles are such that the voltage signal line driver has satisfactory stability. However, when the termination resistance or load is removed or not present, less current may flow through transistors 600 and 700, potentially resulting in operation of these transistors in their weak inversion region. Thus, as a potential result of this weak inversion operation, the dominant pole may occur at a higher frequency due to the lower gate capacitance of transistors 600 or 700. Another potential result is that the parasitic pole previously described may occur at a lower frequency due to the higher output resistance of the termination. The net result is that the dominant and parasitic poles may approach each other in frequency so that the voltage signal line driver may exhibit poor stability and even oscillate when the receiving end of the telecommunications line is not properly terminated.

Figure 3:
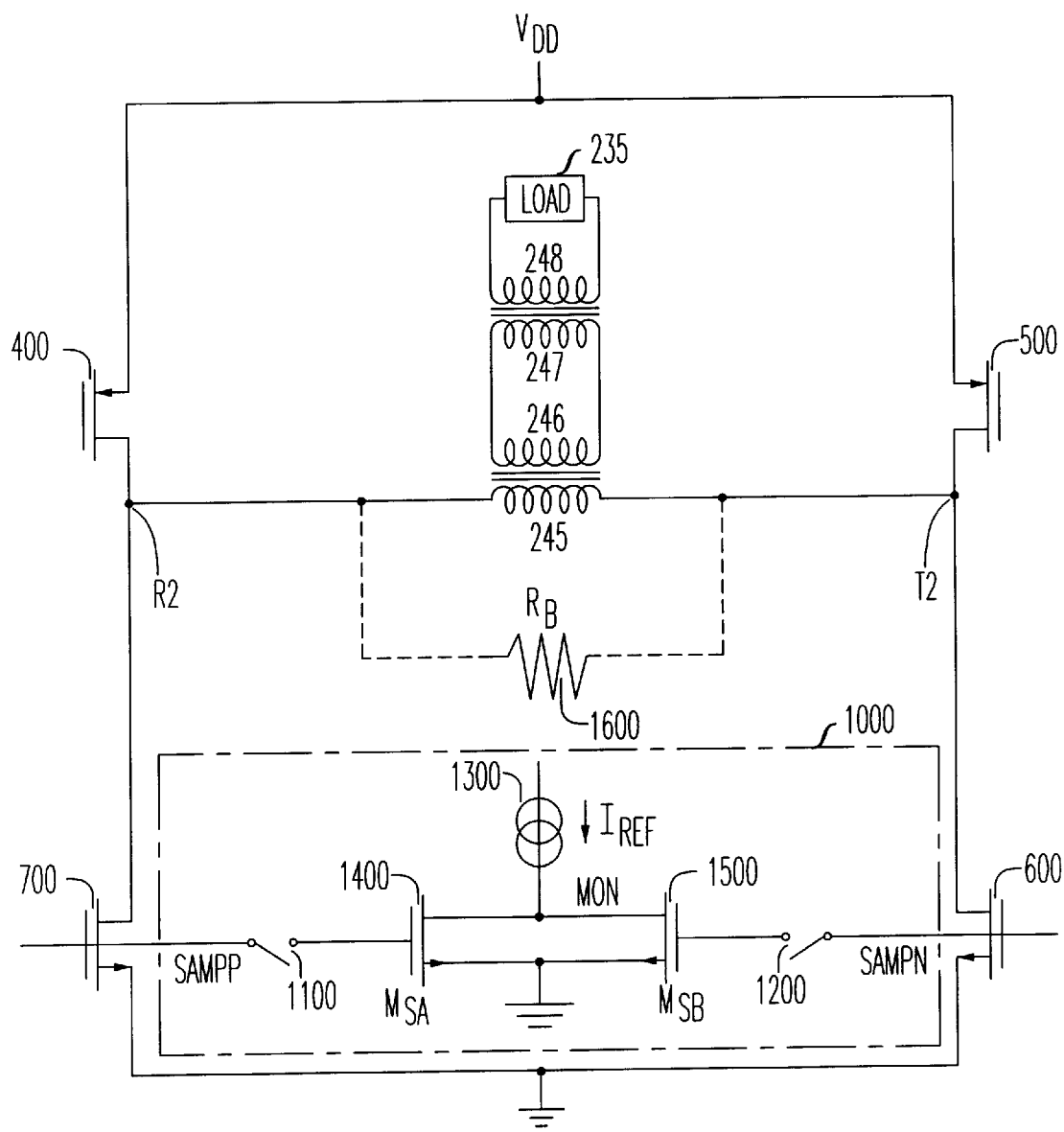
FIG. 3 is a circuit diagram illustrating a portion of the embodiment(s) illustrated in FIG. 1 in greater detail.

One way of avoiding this problem, illustrated in FIG. 3, is to connect a bleeder resistance 1600 across first coil 245. This effectively retains the parasitic pole at a relatively high frequency and the dominant pole at a relatively low frequency. To ensure satisfactory stability, this resistor should be fairly low; however, this approach may impair the power efficiency of the voltage signal line driver and, therefore, is not typically desirable. One alternative approach may include employing a load termination sensing circuit in accordance with the present invention.

As illustrated in FIG. 1, in this particular embodiment pre-driver amplifiers 100 and 200 are biased in a low current or a high current mode of operation. This is illustrated in FIG. 1 by current sources 2300 and 2600, although to bias the pre-driver amplifiers in a high current mode switches 2200 and 2100 should be closed to provide a short circuit connection. As illustrated schematically, switches 2200 and 2100 are actuated by digital control signals ISLPB and ISLNB, respectively. Thus, FIG. 1, the switches are closed to illustrate a "short circuit" when control signals ISLPB and ISLNB are low, although the invention is not limited in scope in this respect. It will, of course, be appreciated that a current source, as depicted in FIGS. 1 and 3, may be implemented by any one of a number of techniques, such as, for example, with an on-chip current mirror that may be achieved, for example, by configuring a CMOS semiconductor device. Likewise, switches 2200 and 2100 may be implemented by any one of a number of techniques, such as by CMOS transmission gates.

The stability problems previously described may be avoided by adjusting the open loop frequency response of the voltage signal line driver, such as by adjusting the bias applied to these amplifiers when the receiving end of the telecommunications line is not properly terminated such as, for example, when no load appears across fourth coil 248. If the bias on the amplifiers is adjusted, for example, so as to operate in a low or lower current mode for this particular embodiment, the previously described dominant pole may be shifted to a sufficiently low frequency that satisfactory stability may be obtained. This occurs because reducing the current bias lowers the transconductance of the amplifier. In order to adjust the bias, such as by switching the amplifiers from a high current mode to a low current mode, it is desirable to sense when a load is present at the receiving end of the telecommunications line.

One technique for sensing the presence of a load termination at the receiving end of a telecommunications line includes measuring the output current of the voltage signal line driver. When the output current is less than a predetermined value, then it is assumed that the load is not present and the above-described stability enhancement technique is implemented. Typically, the output current may be measured by a current sampling technique. Referring now to FIG. 3 and load sensing circuit 1000, the current flowing through output current driver transistors 600 and 700 of the voltage signal line driver may be sampled, scaled and "copied" to transistors 1500 and 1400, respectively. As illustrated, in FIG. 3, the scaling of the actual output current to the sampled current is substantially governed by the ratio of the sizes of transistors 600, 700 to transistors 1500, 1400, respectively. For purposes here, the size of a transistor is the length-to-width ratio thereof. The copying of the output current occurs because the corresponding transistors have the same gate-to-source voltages, while the sampling results from the operations of switches 1200 and 1100. In a typical embodiment, these switches may comprise, for example, CMOS semiconductor devices in which each device couples drain-to-source between the respective transistors, such as between transistors 700 and 1400, and between transistors 600 and 1500. Likewise, the SAMPP and SAMPN digital control signals illustrated may be applied to the gates of the CMOS semiconductor devices to electrically actuate the switch operation of the device. Transistors 1400 and 1500 may have sufficient capacitance so that the output current "sampled" by switches 1100 and 1200 in accordance with digital control signals SAMPP and SAMPN is then "held" or stored by the transistors. Other techniques for measuring the output current other than sampling, and other sampling techniques other than the approach illustrated may, of course, also be employed.

As further illustrated in FIG. 3, for this particular embodiment, the drains of CMOS semiconductor devices 1400 and 1500 are coupled together so as to perform a logical or boolean NOR operation. More specifically, if either of the transistors 600 or 700 is carrying a sufficiently large current, then MON is low. Furthermore, the circuit configuration illustrated operates as a current comparator. The sampled-and-held output current is compared against a fixed reference current ($I_{REF}$), illustrated in FIG. 3 by current source 1300. Although not illustrated, current source 1300 may be formed from a current mirror coupled to a voltage source, such as VDD. The current supplied by $I_{REF}$ is preferably scaled with respect to the predetermined current value by the same ratio the sizes of transistors 600, 700 are to transistors 1500, 1400, respectively, as discussed above.

For this particular embodiment, the sampled output current should be larger than the reference current when the receiving end of the telecommunications line is properly terminated. This occurs because when a proper load termination is present, the reflected load resistance is relatively low providing a relatively high current through transistor 600 or transistor 700. If, however, a load is not present, the sampled output current should be smaller than a reference current. Therefore, by this technique, the presence or absence of a proper termination or load may be sensed. Of course, other types of current comparators may be employed. Furthermore, the scope of the invention is not restricted to the relation illustrated between the sampled line driver output current and the reference current. This relation will, of course, depend on the particular embodiment employed.

The voltage signal output of this comparison between the sampled output current and the reference current, denoted MON in FIG. 3, may then be provided to combinatorial logic or digital logic circuitry in order to signal, in one particular embodiment, an adjustment (or lack of adjustment) of the bias applied to amplifiers 100 and 200. An embodiment of such digital logic circuitry is illustrated in FIG. 4. Thus, FIG. 4 illustrates combinatorial logic that may be employed to adjust the bias on amplifiers 100 and 200. In this particular embodiment, the bias is switched from one bias level to another bias level, as explained below. FIG. 2 also illustrates digital logic circuitry for digital control signals that may be employed for an embodiment of a load sensing circuit, such as that illustrated in FIG. 3, as explained in more detail below. Likewise, FIG. 5 illustrates or provides a truth-table for the digital logic circuitry illustrated in FIGS. 2 and 4 based on a normal load termination (nom.) condition and an unterminated (unterm.) condition.

FIG. 4 illustrates one embodiment of digital logic circuitry that may be used to provide digital control signals to adjust the bias on amplifiers 100 and 200. The invention is, of course, not restricted in scope to this particular embodiment. As illustrated, the signal providing the result of the comparison between the sampled output current and the reference current, denoted MON in FIG. 3, may be provided to two signal inverters, 10 and 20, connected in series. One purpose, in this particular embodiment, for this configuration is to provide more signal gain. As illustrated, the MON2 signal is then provided to a NAND gate 30 in conjunction with digital control signal CTRL. As will be explained in more detail hereinafter, signal CTRL may be used to disable the load termination sensing circuitry, although the scope of the invention is not restricted to including this disabling signal. Next, as illustrated, the digital signal result of this logical NAND, designated MON3, is then provided to two further NAND gates, 40 and 50. As illustrated, the resulting comparison between the sampled output current and the reference current is combined with digital control signals IOP and ION.

IOP and ION represent digital control signals for this particular embodiment that may be supplied by circuitry external to the voltage signal line driver in order to control the bias mode of the pre-driver amplifiers. For example, as explained in more detail in aforementioned patent application Ser. No. 08/607,619 (Lakshmikumar 2), a voltage signal line driver may be employed to realize an output voltage pulse in accordance with the DS1 voltage pulse template. Thus, circuitry external to the voltage line driver may provide control signals to switch the voltage line driver into high current mode at predetermined time periods in order to produce an output voltage pulse substantially in accordance with the template, such as illustrated in FIG. 2 of the aforementioned patent application Ser. No. 08/607,619 (Lakshmikumar 2). It will, of course, be appreciated that a termination sensing circuit in accordance with the present invention is not restricted in scope to the use of such externally-derived digital control signals.

The resulting digital control signals produced by gates 40 and 50, ISLPB and ISLNB, control switches 2200 and 2100, illustrated in FIG. 1, to adjust the bias mode of amplifiers 100 and 200, respectively. As illustrated in the truth-table of FIG. 5, when MON is "high," indicating an unterminated condition, ISLPB and ISLNB are both "high." In this particular embodiment, the signaling convention employed is that switches 2200 and 2100 are closed when signals ISLPB and ISLNB are "low." Thus, the current provided to bias amplifiers 100 and 200 is reduced when ISLPB and ISLNB are "high." The stability of the voltage signal line driver is thereby maintained. Of course, the invention is not restricted in scope to any such particular convention regarding the magnitude or polarity of these digital control signals.

Likewise, FIG. 2 illustrates combinatorial logic or digital logic circuitry to produce the digital control signals for the sample and hold circuitry previously described, although the invention is not restricted in scope to this particular logic circuitry. As illustrated, a signal CTRL is provided which may be employed to disable the load termination sensing circuitry. Likewise, digital control signals CLAMPP and CLAMPN are illustrated. These digital signals are employed as described in aforementioned patent application Ser. No. 08/607,619 (Lakshmikumar 2) to control the operation of the voltage signal line driver. As illustrated, these digital control signals are combined with digital control signals IOP and ION to provide control signals SAMPP and SAMPN. As illustrated in FIG. 1, the output signal provided by this logic circuitry selectively enables the load sensing circuitry 1000, which will in turn permit the voltage signal line driver to go into the high bias current mode only when a proper termination is sensed. Likewise, if needed, this feature may be completely disabled by setting control signal, CTRL in this particular embodiment, low.

This embodiment of a load termination sensing circuit in accordance with the invention provides relatively fast attack and recovery times. In particular, there may be at most one output voltage pulse produced by the amplifiers in high current mode when the receiving end of the communications line is unterminated during a transition from a properly terminated condition to an unterminated condition and vice-versa. This occurs because after a current comparison, as previously described, the current bias may be switched or adjusted. Furthermore, this may occur on a negative or a positive pulse because both transistor 600 and transistor 700 provide output current samples for load sensing circuit 1000. In contrast with alternatives, such as the bleeder resistor previously described, this approach also provides an advantage in that it reduces power dissipation when a termination load is not present.

As an alternative approach to adjusting the bias applied to the amplifiers of the voltage signal line driver, instead a dominant pole may be selectively created, or an existing dominant pole moved lower in frequency, by a capacitor or resistor selectively switched into the amplifier or amplifier configuration circuitry to provide adequate frequency compensation in other embodiments in accordance with the invention. A capacitor approach in accordance with the invention is illustrated in phantom in FIG. 1 by either capacitor 55 and switch 65 or capacitor 15 and switch 25 for amplifier 100 and by either capacitor 85 and switch 75 or capacitor 35 and switch 45 for amplifier 200. In alternative embodiments, the switches may be employed to switch or selectively connect the capacitors into the amplifier configuration circuitry. Thus, a similar technique for sensing the presence of a load termination, as previously described, may be employed. Furthermore, logic circuitry, such as previously illustrated, may be employed in order to connect the capacitor into the circuit when an unterminated condition is sensed, indicated in FIG. 1 by digital control signals ISLPB for switches 25 and 65 and ISLNB for switches 45 and 75. However, in this embodiment, for these switches, as illustrated, the switches are open when signals ISLNB and ISLPB are low, in contrast with switches 2100 and 2200. The approach previously described of adjusting the applied bias, however, has an advantage in that it results in less power dissipation in comparison with employing a resistor or capacitor to provide frequency compensation. Likewise, it will now be appreciated that a combination of approaches to adjust the open loop-frequency response of the voltage signal line driver may be employed.

Unstable operation by a voltage signal line driver for a telecommunications line may be avoided in accordance with the following method. A voltage signal line driver coupled to the telecommunications line may be electrically biased so as to produce voltage signal pulses for transmission over the telecommunications line. This is illustrated, for example, in FIG. 1 in which amplifiers 100 and 200 are biased to operate in a high current mode. Alternatively, the bias mode of the amplifiers may be voltage controlled rather than current controlled. The output current of the voltage signal line driver is measured, in this embodiment by sampling, during driver operation. This may be accomplished by load sensing circuitry, such as load sensing circuit 1000. As previously described, a "sample-and-hold" technique, for example, may be employed. This may be accomplished in an embodiment employing CMOS semiconductor devices to "sample-and-hold" a value of the output current, such as the current of output driver transistors 600 and 700 illustrated in FIG. 1. Of course, the scope of the invention is not restricted to this particular current sampling technique.

Likewise, the open loop frequency response of the voltage signal line driver may be adjusted substantially in accordance with the measured output current of the voltage signal line driver. The bias on the voltage signal line driver may then be adjusted substantially in accordance with the measured output current, for example. Alternatively, a capacitor or resistor may be connected or switched into the circuitry to adjust the open loop frequency response of the voltage signal line driver, as previously described. For the embodiment illustrated in FIG. 1, the voltage signal line driver may be switched from a first bias being applied to the line driver amplifiers to a second bias being applied. As previously described, this may be accomplished by comparing the sampled output current value with a reference current and, based on that current comparison, either maintaining the same bias on the voltage signal line driver or, alternatively, switching the bias on the voltage signal line driver depending on whether the sampled output current is higher than the reference current or lower than the reference current. Likewise, although in one particular embodiment illustrated, a voltage signal line driver having two bias modes is employed, the invention is not restricted in scope in this respect. For example, a voltage signal line driver may have a bias that may be adjusted substantially in accordance with the sampled output current other than by simply switching between two bias modes. For example, the bias may be adjusted in proportion to the sampled output current or in proportion to a comparison between the sampled output current and a reference current. Likewise, as previously suggested, the open loop frequency response of the voltage signal line driver may be adjusted by other techniques, such as by connecting a capacitor or resistor into the line driver circuitry once an unterminated condition is sensed.

While only certain features of the invention have been illustrated and described herein, many modifications, substitutions, changes or equivalents will now occur to those skilled in the art. It is, therefore, to be understood that the appended claims are intended to cover all such modifications and changes that fall within the true spirit of the invention.

What is claimed is:

1. In an integrated circuit, a line driver having an output, comprising:
    an amplifier, having an open-loop frequency response and an output coupled to the output of the line driver;
    a current detector measuring output current of the amplifier; and
    means for changing the open-loop frequency response of the amplifier when the output current of the amplifier is less than a predetermined value.

2. In the integrated circuit, the line driver as recited in claim 1, wherein the open-loop frequency response of the amplifier is reduced when the output current of the amplifier is less than the predetermined value.

3. In the integrated circuit, the line driver as recited in claim 2, wherein the amplifier has a bias current input and the open-loop frequency response is reduced based on the output current of the amplifier by reducing the bias current to the amplifier.

4. In an integrated circuit, a line driver having an output, comprising:
    an amplifier, having an open-loop frequency response and an output coupled to the output of the line driver;
    a current detector measuring output current of the amplifier; and
    means for changing the open-loop frequency response of the amplifier when the output current of the amplifier is less than a predetermined value, wherein the open-loop frequency response of the amplifier is reduced when the output current of the amplifier is less than the predetermined value, wherein the current detector comprises,
        a current mirror outputting a reference current, and
        a sampling circuit, responsive to the amplifier by outputting a scaled current in proportion to the output current of the amplifier;
        wherein if the scaled current is less than the reference current, which is proportional to the predetermined value of current, the open-loop frequency response of the amplifier is reduced.

5. In the integrated circuit, the line driver as recited in claim 4, further comprising a current source coupled to the current mirror.

6. In the integrated circuit recited in claim 2, a balanced line driver having two halves, each of the two halves comprising the line driver.

7. In an integrated circuit, a line driver having an output, comprising:

an amplifier, having an open-loop frequency response and an output coupled to the output of the line driver;

a current detector measuring output current of the amplifier; and means for changing the open-loop frequency response of the amplifier when the output current of the amplifier is less than a predetermined value, wherein the open-loop frequency response of the amplifier is reduced when the output current of the amplifier is less than the predetermined value, wherein the open-loop frequency response is reduced by selectively adding an additional dominant pole to the amplifier.

8. In the integrated circuit, the line driver as recited in claim 7, wherein the additional pole is provided by a capacitor.

9. A method of stabilizing a line driver when a load on the driver is substantially reduced, the driver having an amplifier for supplying an output current to the load, comprising the steps of:

measuring the output current to the load; and reducing the open-loop frequency response of the amplifier when the output current is less than a predetermined amount.

10. The method as recited in claim 9, the step of reducing the open-loop frequency response of the amplifier further comprises:

selectively reducing bias current to the amplifier.

11. A method of stabilizing a line driver when a load on the driver is substantially reduced, the driver having an amplifier for supplying an output current to the load, comprising the steps of:

measuring the output current to the load; and reducing the open-loop frequency response of the amplifier when the output current is less than a predetermined amount, the measuring step further comprises the steps of:

sampling the output current to generate a scaled current at an output, the amount of the scaled current being proportional to the output current; and comparing the scaled current to an amount of current proportional to the predetermined amount, wherein the open-loop frequency response of the amplifier is reduced when the scaled current less than the amount of current proportional to the predetermined amount.

12. The method as recited in claim 11, the step of reducing the open-loop frequency response of the amplifier further comprises:

selectively adding a dominant pole to the frequency response of the amplifier.

* * * * *